(12) United States Patent
Fan et al.

(10) Patent No.: US 7,446,284 B2
(45) Date of Patent: Nov. 4, 2008

(54) ETCH RESISTANT WAFER PROCESSING APPARATUS AND METHOD FOR PRODUCING THE SAME

(75) Inventors: Wei Fan, Middleburg Heights, OH (US); Ajit Sane, Medina, OH (US); Jeffrey Lennartz, Cleveland, OH (US); Tae Won Kim, Medina, OH (US)

(73) Assignee: Momentive Performance Materials Inc., Albany, NY (US)

( * ) Notice: Subject to any disclaimer, the term of this patent is extended or adjusted under 35 U.S.C. 154(b) by 177 days.

(21) Appl. No.: 11/322,809

(22) Filed: Dec. 30, 2005

(65) Prior Publication Data

US 2007/0138601 A1    Jun. 21, 2007

Related U.S. Application Data

(60) Provisional application No. 60/752,677, filed on Dec. 21, 2005.

(51) Int. Cl.
*H05B 3/68* (2006.01)
*H01L 23/58* (2006.01)

(52) U.S. Cl. .................. 219/444.1; 219/385; 219/411; 219/405; 118/500; 118/724; 118/725; 118/728; 118/730; 361/233; 361/234; 269/903; 279/128; 257/632

(58) Field of Classification Search ................ 219/385, 219/411, 405, 444.1; 118/500, 724–5, 728–30; 361/233–4; 269/903; 279/128; 257/632
See application file for complete search history.

(56) References Cited

U.S. PATENT DOCUMENTS

| 4,960,734 | A | 10/1990 | Kanai |
| 5,280,156 | A | 1/1994 | Niori et al. |
| 5,663,865 | A | 9/1997 | Kawada et al. |
| 6,744,618 | B2 * | 6/2004 | Divakar et al. ............ 361/234 |

FOREIGN PATENT DOCUMENTS

| JP | 07-153820 | 6/1995 |
| JP | 1999-040330 | 12/1999 |

* cited by examiner

*Primary Examiner*—Shawntina Fuqua
(74) *Attorney, Agent, or Firm*—Dominick G. Vicari

(57) ABSTRACT

A wafer processing apparatus is fabricated by depositing a film electrode onto the surface of a base substrate, the structure is then overcoated with a protective coating film layer comprising at least one of a nitride, carbide, carbonitride or oxynitride of elements selected from a group consisting of B, Al, Si, Ga, refractory hard metals, transition metals, and combinations thereof. The film electrode has a coefficient of thermal expansion (CTE) that closely matches the CTE of the underlying base substrate layer as well as the CTE of the protective coating layer.

14 Claims, 2 Drawing Sheets ured to the base substrate surface, the film electrode CTE ranges from 0.75 to 1.25 of the CTE of the base substrate.

ETCH RESISTANT WAFER PROCESSING APPARATUS AND METHOD FOR PRODUCING THE SAME

CROSS REFERENCE TO RELATED APPLICATION

This application claims priority of U.S. Application No. 60/752,677, filed on Dec. 21, 2005, and U.S. patent application Ser. No. 10/875,861, filed on Jun. 25, 2003, which patent applications are fully incorporated herein by reference.

FIELD OF INVENTION

The invention relates generally to a wafer handling apparatus for use in the manufacture of semiconductors.

BACKGROUND OF THE INVENTION

Wafer handling apparatuses, e.g., heaters and electrostatic chucks ("ESC"), are used in a number of system applications such as molecular beam epitaxy, space experiments, substrate heaters for electron microscopy and in the growth of superconducting films, etc. A wafer handling assembly may include a susceptor for supporting a wafer, and a plurality of heaters disposed under the susceptor to heat the wafer. The semiconductor wafer is heated within a confined environment in a processing vessel at relatively high temperature and often in an atmosphere, which is highly corrosive.

AlN exhibits excellent etch resistant characteristics, making it an outstanding candidate as a construction material for wafer handling apparatuses. U.S. Pat. No. 6,744,618 discloses an electrostatic chuck having a screen printed film electrode deposited onto a surface of a sintered ceramic substrate, and a sintered ceramic layer over-molded on top of the film electrode structure. The film electrode includes W, Mo, or alloys thereof. The ceramic layer comprises materials such as AlN, $Al_2O_3$, BN, $Si_3N_4$, and combinations thereof, AlN is a preferred embodiment.

A well-known problem with the sintered AlN etch resistant heaters of the prior art is their low thermal shock resistance, limiting their maximum ramp to approximately 12 to 20° C./min. In addition, the generation of backside particles becomes a serious issue when sintered AlN contacts the wafer in process.

The invention relates to an improved wafer handling apparatus with a layered structure having at least a film layer of AlN as a top coating, exhibiting excellent etch resistance to fluorine and less backside particle generation and less contamination to the wafer process, as compared to the sintered layered structure of the prior art.

SUMMARY OF THE INVENTION

In one aspect, the invention relates to a wafer processing apparatus fabricated by depositing a film electrode onto the surface of a base substrate, the structure is then overcoated with a protective coating film layer comprising at least one of a nitride, carbide, carbonitride or oxynitride of elements selected from a group consisting of B, Al, Si, Ga, refractory hard metals, transition metals, and combinations thereof, wherein the film electrode has a coefficient of thermal expansion (CTE) that closely matches the CTE of the base substrate layer as well as the CTE of the protective coating layer.

In one aspect of the invention, the film electrode comprises at least one of molybdenum, tungsten, ruthenium, and alloys thereof, and the protective coating layer comprises at least one of aluminum nitride, aluminum oxide, aluminum oxynitride or combinations thereof.

In another aspect of the invention, the film electrode has a CTE ranging from 0.75 to 1.25 of the CTE of the base substrate layer and the CTE of the protective coating layer.

In yet another aspect, the invention relates to a method for producing a wafer processing apparatus, comprising the steps of: a) providing a base substrate comprising at least one of graphite, refractory metals and alloys, a oxide, nitride, carbide, carbonitride or oxynitride of elements selected from a group consisting of B, Si, Ga, refractory hard metals, transition metals, or an oxide, oxynitride of aluminum, and combinations thereof; and with or without an electrically insulating layer; b) depositing a film electrode onto the base substrate, the film electrode has a CTE ranging from 0.75 to 1.25 of the CTE of the base substrate layer; c) overlaying the film electrode with a coating film layer having a CTE ranging from 0.75 to 1.25 of the CTE of the film electrode.

DETAILED DESCRIPTION OF THE INVENTION

As used herein, the terms "first," "second," and the like do not denote any order or importance, but rather are used to distinguish one element from another, and the terms "the", "a" and "an" do not denote a limitation of quantity, but rather denote the presence of at least one of the referenced item. All ranges disclosed herein are inclusive and combinable. Furthermore, all ranges disclosed herein are inclusive of the endpoints and are independently combinable. Also, as used in the specification and in the claims, the term "comprising" may include the embodiments "consisting of" and "consisting essentially of."

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases. In at least some instances, the approximating language may correspond to the precision of an instrument for measuring the value.

As used herein, "substrate" or "substrates" may be used interchangeably with "base surface" or "base layer."

Also as used herein, the term "wafer handling apparatus" may be used interchangeable with "heater," "chuck," "electrostatic chuck," "ESC," and "susceptors" in the singular or plural form, referring to a device to support a wafer, a substrate, or another type of workpiece during the manufacture of semiconductor devices. In one embodiment of a wafer handling apparatus, a wafer is secured to the chucking surface by the electrostatic force generated between an external electrode and an electrode embedded in the wafer handling apparatus. ESC can be of the Columbic type or of Johnson-Rahbek type.

As used herein, "protective coating" layer may be used interchangeably with "protective film coating layer," "coating layer," or "coating film," or "protective layer," or "protective coating layer," used in singular or plural form, indicating at least one layer or a plurality of layers coating the wafer handling apparatus.

Figure 1:
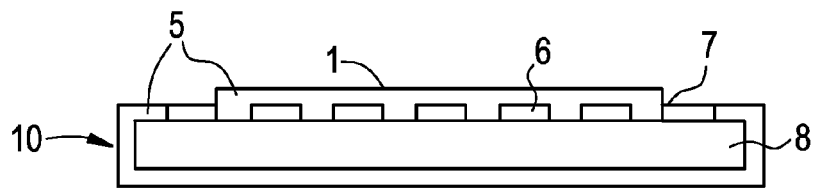
FIG. 1 is a cross-section diagram of one embodiment of the wafer handling apparatus of the invention.

In one embodiment as illustrated in the schematic diagram of FIG. 1, the wafer processing apparatus 10 of the invention is in the form of a heater, including a base substrate 8, film electrode 6 disposed thereon, and a protective coating film 5 overcoating the entire structure.

Figure 2:
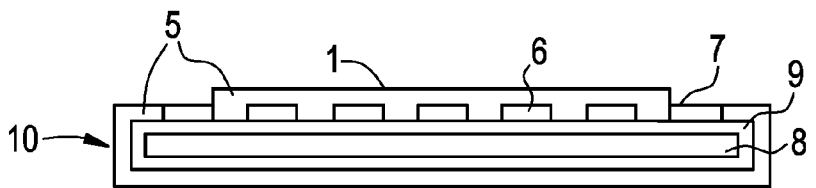
FIG. 2 is a cross-section diagram of a second embodiment of the wafer handling apparatus of the invention, for the base substrate to be over-coated by an electrically insulating layer.

In a second embodiment as illustrated in FIG. 2, wafer processing apparatus 10 comprises a substrate 8 over-coated by a base layer 9, a film electrode 6 disposed on the base layer 9, and a protective coating film 5 over-coating the entire structure.

Figure 3:
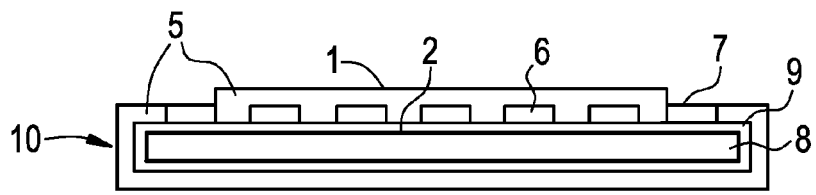
FIG. 3 is a cross-section diagram of a second embodiment of the wafer handling apparatus of the invention, with an interfacial tie-layer in-between the base substrate and the electrically insulating layer.

In a third embodiment as illustrated in FIG. 3, wafer processing apparatus 10 comprises a substrate 8, coated first by an tie-layer 2, then over-coated by the base layer 9, a film electrode 6 disposed on the base layer 9, and a protective coating film 5 over-coating the entire structure.

Figure 4:
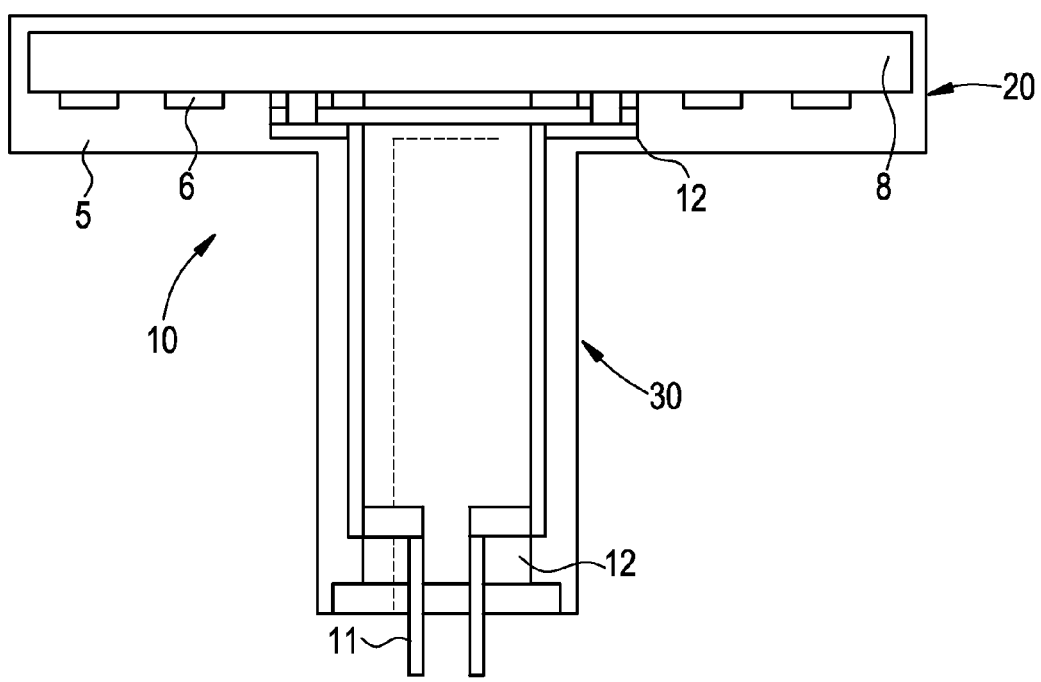
FIG. 4 is a cross-section diagram of a heater embodiment of the invention having a center shaft for support.

In a fourth embodiment as illustrated in FIG. 4, wafer-processing apparatus 10 comprises a platform 20 for supporting an object to be heated. The platform 20 has a substrate 8 having an upper and a lower surface, and a film electrode 6 being disposed on the lower surface of the substrate 8. The platform 20 is supported by a shaft 30 extending substantially transverse to the platform. The shaft 20 may comprise of the same material as or different material from the substrate 8, further comprising two conductors or electrical leads 11 in a concentric design or other pattern thereof. Metal via or contact hole 12 is brazed onto shaft 30 for use in conjunction with a mounting structure, post, or a pedestal post to support the wafer processing apparatus.

Hereinafter, the invention will be explained in more detail with starting with the outermost layer of the apparatus of the invention going inwards, i.e., from the protective coating film, the film electrode, the optional base coating layer and optional tie-layer in some embodiments, to the inner most layer being the base substrate.

Protective Coating Film: In one embodiment, the protective coating film 5 comprises at least a nitride, carbide, carbonitride or oxynitride of elements selected from a group consisting of B, Al, Si, Ga, refractory hard metals, transition metals, and combinations thereof, having a CTE ranging from $2.0 \times 10^{-6}$/K to $10 \times 10^{-6}$/K in a temperature range of 25 to 1000° C.

In one embodiment, the nitride is selected from one of pyrolytic boron nitride, aluminum nitride (AlN), aluminum oxide, aluminum oxynitride, silicon nitride, or complexes thereof. As used herein, aluminum nitride refers to AlN, AlON, or combinations thereof. In one embodiment, the protective coating layer 5 is a single layer of AlN, AlON, $Al_2O_3$ or combinations thereof. In another embodiment, it is a multilayer of multiple coatings of the same material, e.g., AlN, AlON, $Al_2O_3$, etc., or multiple different layers of AlN, AlON, pBN, SiN, etc., coated in succession.

The protective coatings layer 5 may be deposited on substrates by processes comprising expanding thermal plasma (ETP), ion plating, chemical vapor deposition (CVD), plasma enhanced chemical vapor deposition (PECVD), metal organic chemical vapor deposition (MOCVD) (also called Organometallic Chemical Vapor Deposition (OMCVD)), metal organic vapor phase epitaxy (MOVPE), physical vapor deposition processes such as sputtering, reactive electron beam (e-beam) deposition, and plasma spray. Exemplary processes are ETP, CVD, and ion plating.

The thickness of the protective coating layer 5 may be varied depending upon the application and the process used, e.g., CVD, ion plating, ETP, etc, varying from 1 μm to a few hundred μm, depending on the application. Longer life cycles are generally expected when thicker protective layers are used. In one embodiment, the protective coating layer has thickness of about 1 to about 5 μm, generally permit good thermal contact between the wafer and the electrostatic chuck, but do not last as long as coatings having greater thicknesses. Coatings having thicknesses of greater than 5 μm, however, have longer life cycles than coatings having thickness of less than 5 μm. In one embodiment, the coating has a thickness of greater than or equal to about 2 micrometers (μm). In another embodiment, the protective coating thickness is greater than or equal to about 10 μm. In a third embodiment, the thickness is greater than or equal to about 50 μm. In yet another embodiment, the thickness is greater than or equal to about 75 μm.

The protective coating layer 5 is characterized as being etch-resistant, or having a low-etch rate in an environment comprising halogens or when exposed to plasma etching, reactive ion etching, plasma cleaning and gas cleaning. The etch rate for the protective coating is equal or lower than coatings of a similar chemical composition that are sintered in the prior art, and thus extending the life of the wafer processing apparatus.

In one embodiment, the protective coating layer 5 has an etch rate of less than 1000 Angstroms per minute (Å/min) in a halogen-containing environment. In a second embodiment, this rate is less than 500 Angstroms per minute (Å/min). In a third embodiment, the rate is less than 100 Angstroms per minute (Å/min). In a fourth embodiment, the etch resistant protective coating is less than or equal to about 30 Angstroms per minute (Å/min) in a cleansing environment that comprises halogens or when exposed to a reactive ion etching environment. In one embodiment, the etch rate is less than or equal to about 20 Å/min. In another embodiment, the etch rate is less than or equal to about 15 Å/min. In yet another embodiment, the etch rate is less than or equal to about 5 Å/min. In a further embodiment, the etch rate is less than or equal to about 2 Å/min.

When articles such as hot plates, electrostatic chucks, wafer carriers, or the like, are used during semiconductor processing operations, particles are often formed on the contact surface of the heater/chucks, and are often transferred to the backside of wafer. The formation of these particles is undesirable, since they can be transferred on to the backside of the process wafers. Wafer processing devices having the protective film coating layer 5 of the invention display a significant reduction in the number of such particles formed.

In one embodiment, the number of particles formed on the backside of an article coated with the protective coating is reduced by at least 25% over wafer processing apparatuses of the prior art with a sintered overmold or top coating layer. In another embodiment, the number of particles produced is reduced by at least 50% over a similar article that is not coated with the protective coating. In a third embodiment, the number of particles produced is reduced by at least 75% over a similar article that is not coated with the protective coating.

The protective coating layer 5 can accommodate small concentrations of other non-metallic elements such as nitrogen, oxygen and/or hydrogen without any deleterious effects on corrosion resistance or etch resistance. In one embodiment, the coating layer contains up to about 20 atomic percent (atom %) of hydrogen and/or oxygen. In another embodiment, the protective coating comprises hydrogen and/or oxygen up to about 10 atom %.

Film Electrode: The film electrode 6 of the apparatus 10 of the invention is characterized as comprising a metal having a melting point of greater than 1500° C. and a coefficient of thermal expansion (CTE) that is closely matches the CTE of the adjacent base layer 9 (or substrate 8 as in FIG. 1) that it is disposed on, as well as the CTE of the protective coating layer 5, i.e., having a CTE ranging from $2.0 \times 10^{-6}$/K to $10 \times 10^{-6}$/K in a temperature range of 25 to 1000° C.

As used herein, having a closely matched CTE means that the CTE of the film electrode is between 0.75 to 1.25 of the CTE of the adjacent layer, e.g., the base coating layer or the protective coating layer. In one embodiment of the invention, the film electrode has a CTE ranging from 0.90 to 1.10 of the CTE of the adjacent layer, i.e., the base coating layer or the protective coating layer. In a third embodiment, a CTE in the range of 0.95 to 1.05 of the CTE of the adjacent layer.

For embodiments wherein different materials are used, e.g., a combination of AlN and a second phase such as graphite for the base layer 9 or the protective coating layer 5, with AlN having a theoretical average CTE of $4.9 \times 10^{-6}$/K and graphite having a theoretical CTE of $5.3 \times 10^{-6}$/K, then the resultant CTE can be calculated using the standard rules of mixture by using volumetric proportionality rules of averaging.

In one embodiment, the film electrode 6 includes a metal, such as, but not limited to, molybdenum (Mo), tungsten (W), ruthenium (Ru) or combinations thereof. Mo has a theoretical average CTE in the range of 20-1000° C. of $4.5 \times 10^{-6}$/K. Theoretical average CTE of W is $4.5 \times 10^{-6}$/K, and Ru is $6.4 \times 10^{-6}$/K. As the film electrode 6 of the invention has a CTE that closely matches that of the adjacent base layer 9 (or the base substrate 8 as in FIG. 1), thus allowing a good adhesion toward the base and mitigating the delamination or cracking defects in the electrode layer.

In one embodiment, the film electrode 6 has a thickness ranging from about 5 microns to about 250 µm. In a second embodiment, the film electrode 6 has a thickness ranging from 0.1 to 10 µm.

The film electrode 6 may be formed on the base layer by processes known in the art including screen-printing, spin coating, plasma spray, spray pyrolysis, reactive spray deposition, sol-gel, combustion torch, electric arc, ion plating, ion implantation, sputtering deposition, laser ablation, evaporation, electroplating, and laser surface alloying.

In one embodiment, film electrode 6 is formed by screen printing. Screen printing is known in the art. A general description of screen printing is presented, for example, in Screens and Screen Printing, published by the International Society for Hybrid Microelectronics, 1991, incorporated herein by reference, in its entirety. In one embodiment of the invention, a paste including tungsten, molybdenum, ruthenium, or alloys thereof is employed to form electrode 6. A silk screen or other fine mesh can be used. Many conventional pastes for silk screening contain glass frit, added to the paste to promote adhesion. In another embodiment of the invention, film electrode 6 is formed by employing silk screening glass-free conductive pastes. In comparison with conventional pastes which contain glass frit, electrodes fabricated with glass-free pastes have significantly lower resistivity, thus preventing film electrode 6 from heating up when used as a plasma generating (RF) electrode or as a chucking electrode.

In one embodiment, film electrode 6 also can be formed by vapor deposition techniques, such as, for example, chemical vapor deposition (CVD) or physical vapor deposition (PVD). These techniques also are known in the art. Films produced by screen printing often are referred to as "thick" films, whereas films produced by vapor deposition often are referred to as "thin" films.

In yet another embodiment, the film electrode 6 is formed using reactive spray deposition technology (RSDT). RSDT is also known as flame assisted deposition or plasma spray, a low cost combustion process for depositing films with controllable size, morphology and crystallinity.

After a film layer comprising W, Mo, Ru or combinations thereof are deposited onto the base layer, an electrode pattern design can then be reproduced precisely on the Mo (W) film via various techniques, for instance, laser cutting, printing, masking, lathing, dry/wet etching or grit blasting. Therefore, precise heating control can be achieved easily via the precise patterning and so is the heating uniformity.

Optional Base Coating Layer: In a second embodiment of the invention as illustrated in FIG. 2, wherein the base core substrate 8 comprises a core material of at least a conductive material selected from the group of graphite, refractory metals and alloys such as Mo, W, and the like, the substrate 8 is first over-coated by a base coating layer 9 prior to the forming of the film electrode 6 thereon. The core 8 of graphite, refractory metals/alloys give the base coating layer 9 the mechanical integrity and support necessary for use in operation. The base coating layer 9 is electrically insulating, providing the electrical insulation and CTE match between the electrical layer 6 and the base substrate 8.

In one embodiment, the electrically insulating coating layer 9 (with high volume resistivity) comprises at least one of a nitride, boride, oxide, oxynitride of elements selected from a group consisting of B, Al, Si, Ga, refractory hard metals, transition metals, and combinations thereof.

The resistivity of the base coating layer 9 is controlled by controlling the amount of oxide, oxynitride, nitride, and boride formation during the deposition of the metallic component and the derivatives. In one embodiment, the layer 9 has a volume resistivity of $>10^8 \Omega$-cm at 25° C. In a second embodiment, the layer 9 has a volume resistivity of $>10^{10} \Omega$-cm at 25° C. In a third embodiment, a volume resistivity of $>10^{12} \Omega$-cm at 25° C. In one embodiment, the base coating layer has a CTE ranging from $2.0 \times 10^{-6}$/K to $10 \times 10^{-6}$/K in a range of 25 to 1000° C.

The base coating layer 9 may be deposited on the base core 8 by processes comprising expanding thermal plasma (ETP), ion plating, chemical vapor deposition (CVD), plasma enhanced chemical vapor deposition (PECVD), metal organic chemical vapor deposition (MOCVD) (also called Organometallic Chemical Vapor Deposition (OMCVD)), metal organic vapor phase epitaxy (MOVPE), physical vapor deposition processes such as sputtering, reactive electron beam (e-beam) deposition, and plasma spray. Exemplary processes are ETP, CVD, and ion plating.

Optional Tie-layer: In a third embodiment as illustrated in FIG. 3, prior to the deposition of the layer 9 onto the base core substrate 8, an interfacial tie-layer 2 in introduced onto the base substrate 8. The interfacial tie-layer 2 helps enhance the adhesion between the base electrically insulating coating layer 9 and the base substrate 8. In one embodiment, the interfacial tie-layer 2 comprises at least one of: a nitride, carbide, carbonitride, boride, oxide, oxynitride of elements selected from Al, Si, refractory metals including Ta, W, Mo, transition metals including titanium, chromium, iron; and mixtures thereof. In one embodiment, the tie-layer comprises at least one of a TiC, TaC, SiC, MoC, and mixtures thereof.

In one embodiment wherein the base substrate 8 comprises a material such as graphite and the tie-layer comprises a metal carbide, the tie-layer surface is further carburized to restore its stoichiometry by means of diffusion of carbon from the surface into the metal carbide so as to reach an equilibrium with the graphite substrate, enhancing the adhesion of the layers. In one embodiment, the tie-layer comprising refractory metal carbide is characterized by having an atomic ratio of carbon to metal that is in equilibrium with carbon.

The interfacial tie-layer 2 may be precipitated onto the base core substrate 8 by chemical vapor deposition (CVD) in a conventional manner by introducing vapors of a metal halide, e.g., metal chloride, with or without a reducing agent such as hydrogen into a heated reactor containing the graphite substrate. The tie-layer 2 may also be coated onto the substrate 8 by other conventional coating methods including sputtering, molecular beam epitaxy method (MBE), metalorganic chemical vapor deposition (MOCVD), or plasma CVD method (PCVD). In one embodiment, carbon source such as methane may be introduced along with the metal halide vapor to control the C/metal ratio during deposition.

After the base core substrate 8 is coated by the tie-layer 2, then the base coating layer 9 may be introduced onto the tie-layer 2 using any of the processes described above, e.g., CVD, ETP, ion plating, PECVD, MOCVD, OMCVD, MOVPE, sputtering, e-beam deposition, and plasma spray.

Base Substrate Layer: In embodiments of the invention as illustrated in FIGS. 2 and 3, the base substrate 8 is electrically conductive, comprising at least one of graphite; refractory metals such as W and Mo, transition metals, rare earth metals and alloys; and mixtures thereof. As there is a base coating layer 9 (and in some examples, an additional tie-layer 2) separating the base substrate 8 from the electrode 5, the CTE of the base substrate 8 does not have to be closely match the CTE of the electrode layer 5.

In another embodiment of the invention as illustrated in FIG. 1 wherein the electrode is disposed directly onto the base substrate, the base substrate 8 is electrically insulating, comprising at least one of an oxide, nitride, carbide, carbonitride or oxynitride of elements selected from a group consisting of B, Si, Ga, refractory hard metals, transition metals; oxide, oxynitride of aluminum; and combinations thereof. In one embodiment, the electrically insulating substrate has a volume resistivity in the insulator region of semiconductor, e.g., greater than $10^8 \Omega$-cm at 25° C. In a second embodiment, the electrically insulating substrate has a volume resistivity $>10^{10} \Omega$-cm at 25° C. In a third embodiment, a volume resistivity $>10^{12} \Omega$-cm at 25° C. In one embodiment, the base substrate 8 has a CTE ranging from $2.0 \times 10^{-6}$/K to $10 \times 10^{-6}$/K in a range of 25 to 1000° C.

In one embodiment of the apparatus in FIG. 1, the base substrate 8 comprises a material characterized as having an excellent machinability as well as electrically insulating characteristics. In one embodiment, the base substrate 8 comprises blend of boron-nitride and aluminum nitride, giving the base substrate the required integrity as well as the machinability into desired shapes. In one embodiment, the sintered blend comprises a composition as disclosed in U.S. Pat. No. 4,960,734, for a composition with 45 to 5% by weight of AlN to 55 to 95% by weight of BN, for a relatively small thermal expansion coefficient, a low dielectric constant and excellent machinability, while maintaining a high thermal conductivity and a high electrically insulating property.

In another embodiment, the sintered base substrate may further include sintering aids, metal or carbon dopants and impurities. Examples of suitable sintering aids include, but are not limited to, yttria ($Y_2O_3$), calcium fluoride ($CaF_2$), calcium oxide (CaO), calcium carbonate ($CaCO_3$), and others known in the art. Metal dopants may include iron, copper, nickel, zinc, chromium, cobalt, sodium, potassium, magnesium, calcium, titanium, vanadium, and zirconium.

Forming electrical contacts: In one embodiment of the invention, the apparatus 10 further include a electrical contact 12. Methods for forming an electrical contact 12 at electrode 6 are known in the art. Electrical contact 12 can be brazed to the electrode 6, using braze materials known in the art. In one embodiment, electrical contact 12 includes an alloy having one metal in common with electrode 6.

Applications of the Apparatus of the Invention: The apparatus of the invention with a protective coating layer and closely matched CTE electrode can be advantageously used for semi-conductor processing components such as substrates, heating elements, wafer carriers, electrostatic chucks, susceptors, or the like. The apparatus is particularly suitable for applications with heating stage ranging from room temperature to 1000° C. or higher in a short period of time, as well as for applications in harsh environments such fluorine plasma cleaning at temperatures of greater than or equal to about 200° C.

In one embodiment of an application, the apparatus 10 is positioned through mechanical supports in a process chamber. Voltage is applied to apparatus 10 through contact 12, connecting the electrode 6 to a power supply, thereby securing a workpiece such as a semiconductor wafer to the chucking surface 1.

In one embodiment of the invention, the apparatus 10 allows a wafer substrate placed on the heater to be heated quickly to a temperature of up to 800° C. at a rate of >15° C. per minute. In yet another embodiment, the apparatus 10 allows a wafer substrate to be heated at a ramp rate of >20° C./min. In a third embodiment, at a rate of >30° C./min. Even with the high ramp rates, the CTE matching of the protective coating layer, the film electrode, and the base substrate allows the apparatus of the invention to withstand thermal cycling without cracking. The protective coatings have very few cracks and this feature provides significant resistance against etching. In one embodiment, no cracks are formed when the protective coating is thermally cycled to temperatures as high as 800° C.

EXAMPLES

Examples are provided herein to illustrate the invention but are not intended to limit the scope of the invention.

Example 1

A heater having the architecture illustrated in FIG. 1 was produced with a 4" diameter sintered AlN disk having a thickness of 0.125" as the base substrate reference. Screen printed Mo-Mn (30% frit) electrodes were printed onto the substrate for a film thickness of 50 μm. The structure was coated with a layer of CVD AlN of a thickness of 50 to 100 μm. The CVD process to form AlN coatings was conducted in a furnace at a temperature of about 1000° C., wherein $Cl_2$ flow in the range of 1-3 slm was passed through hot Al bars at about 350 to 500° C., and further mixed with $NH_3$ at a flow rate of 1-10 slm, $N_2$ of 5-8 slm, and $H_2$ of 0.8-5 slm.

The disk heater was powered to cycle between 200° C. to 600° C. with ramp rates from 5° C., 15° C., and 30° C. The heater demonstrated excellent thermal shock resistance and mechanical integrity even after the heating tests. However, during rapid heating, it was observed that if the contacts were noticeably cooler than the center (a difference of >50° C.), cracking would occur with the cracking roughly in between the two cooler contacts at the diametrically opposite ends.

Figure 5:
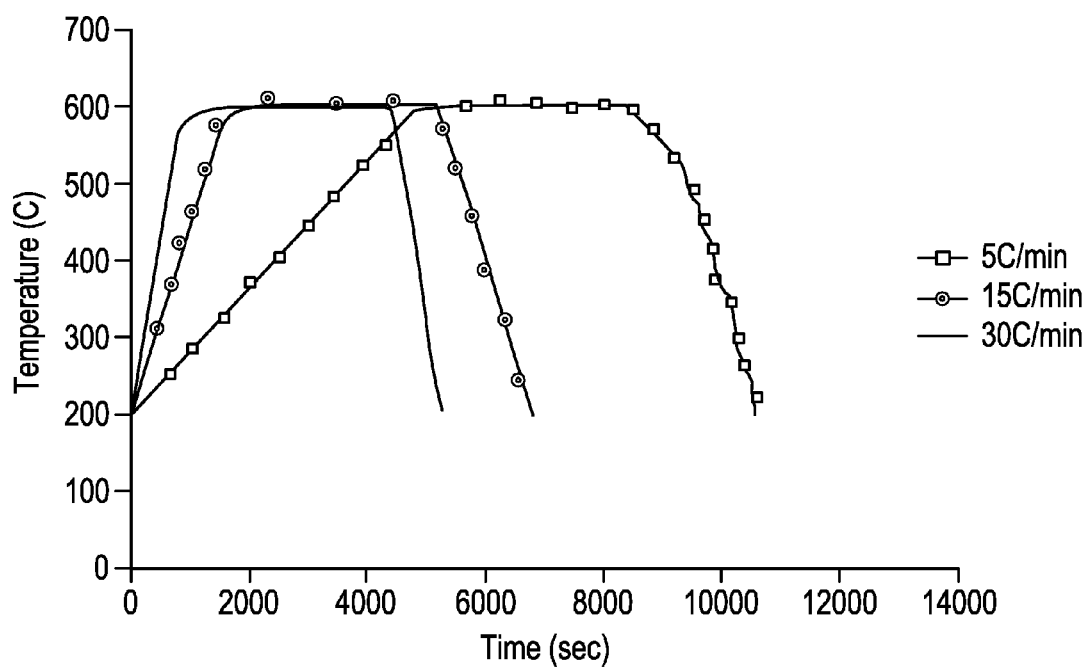
FIG. 5 is a graph illustrating the ramp rates of a disk heater with the embodiment of FIG. 1.

FIG. 5 is a graph showing the results of the ramp test, illustrating that the heater of the invention ramps up quickly at a rate far exceeding the maximum rate achieved with the heaters of the prior art with a sintered coating layer.

Example 2

A heater having the architecture illustrated in FIG. 2 was produced with a 4" diameter disk having a graphite core having a thickness of 0.25", and a CVD AlN coating layer of a thickness of 100 to 200 µm as the base substrate. A 10 µm thick TaC tie layer was used between the CVD AlN layer and the graphite core. Screen printed Mo—Mn (30% frit) electrodes were printed onto those substrates for a film thickness of 50 µm, and final-coated by another layer of CVD AlN with a film thickness of 50 to 100 µm. The prototype disk heater was powered to cycle between 400° C. to 600° C. with ramp rates from 15° C. to 30° C. The CVD process to coat AlN was the same as in Example 1.

Figure 6:
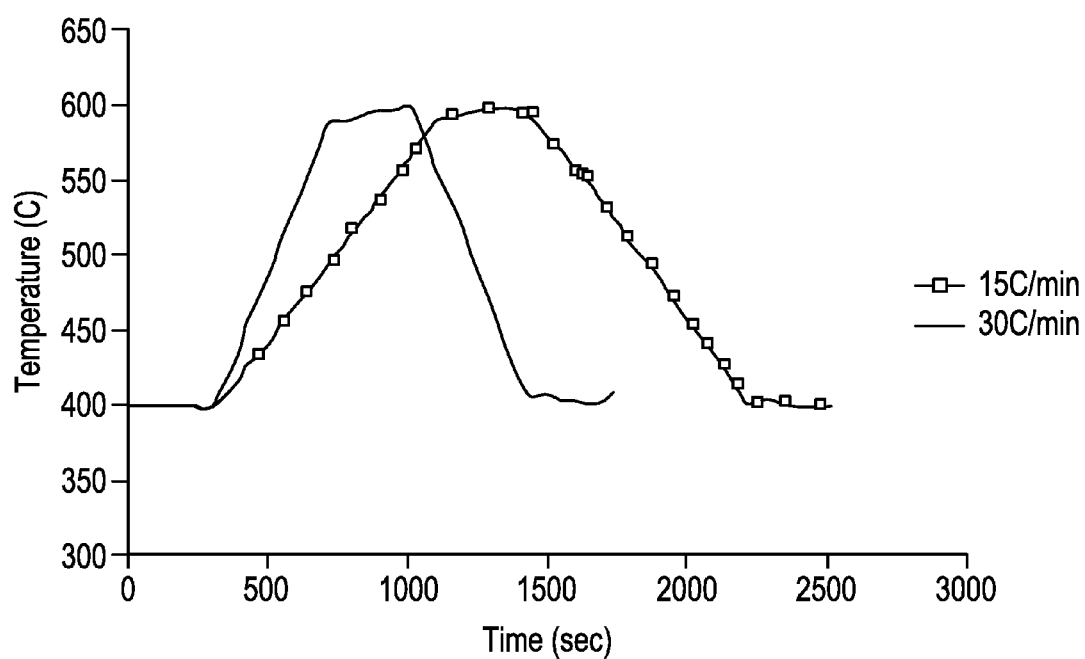
FIG. 6 is a graph illustrating the ramp rate of a disk heater with the embodiment of FIG. 2.

FIG. 6 is a graph showing the results of the ramp test, showing that the heater ramps up quickly in a short period of time, while still maintaining excellent thermal shock resistance and mechanical integrity. Multiple thermal life cycles were performed, demonstrating the outstanding reliability of such architecture.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. All citations referred herein are incorporated by reference.

The invention claimed is:

1. A wafer processing apparatus comprising a platform for placement of an object of various sizes to be processed, the platform comprising: a base substrate comprising at least one of an oxide, nitride, oxynitride of B, Si, Ga, and combinations thereof; a film electrode deposited upon the base substrate; at least a coating layer disposed on the film electrode, the coating layer comprising at least one of a nitride, carbide, carbonitride, oxynitride of elements selected from a group consisting of B, Al, Si, Ga, refractory hard metals, transition metals, and combinations thereof; wherein the film electrode has a coefficient of thermal expansion (CTE) in a range of 0.75 to 1.25 times that of the base substrate and the coating layer respectively; and wherein the base substrate is electrically insulating, and wherein the base substrate has a volume resistivity greater than $10^8 \Omega$-cm at 25° C.

2. The wafer processing apparatus of claim 1, wherein the base substrate has a volume resistivity >$10^{10}\Omega$-cm at 25° C.

3. The wafer processing apparatus of claim 1, wherein the base substrate comprises a sintered ceramic material containing 45 to 5% by weight of AlN to 55 to 95% by weight of BN.

4. The wafer processing apparatus of claim 1, wherein the film electrode comprises at least one of molybdenum, tungsten, ruthenium, and alloys thereof.

5. The wafer processing apparatus of claim 1, wherein the coating layer comprises aluminum nitride.

6. The wafer processing apparatus of claim 1, wherein the coating layer has a CTE ranging from $2.0 \times 10^{-6}$/K to $10 \times 10^{-6}$/K in a temperature range of 25 to 1000° C.

7. The wafer processing apparatus of claim 1, wherein the film electrode has a CTE of 0.90 to 1.10 times that the base substrate and the coating layer, respectively.

8. The wafer processing apparatus of claim 1, wherein the base substrate has a CTE ranging from $2.0 \times 10^{-6}$/K to $10 \times 10^{-6}$/K in a temperature range of 25 to 1000° C.

9. The wafer processing apparatus of claim 1, wherein the coating layer is deposited on the film electrode by at least one of expanding thermal plasma (ETP), chemical vapor deposition (CVD), plasma enhanced chemical vapor deposition, metal organic chemical vapor deposition, metal organic vapor phase epitaxy, sputtering, electron beam and plasma spray.

10. The wafer processing apparatus of claim 1, wherein the film electrode is deposited onto the electrically insulating layer by at least one of screen-printing, spin coating, plasma spray, spray pyrolysis, reactive spray deposition, sol-gel, combustion torch, electric arc, ion plating, ion implantation, sputtering deposition, laser ablation, evaporation, electroplating, and laser surface alloying.

11. The wafer processing apparatus of claim 10, wherein the film electrode is deposited on the coating layer by at least one of screen-printing and plasma spray.

12. A method for producing a wafer processing apparatus, comprising the steps of: providing a base substrate comprising at least one of an oxide, nitride, carbide, carbonitride, oxynitride of B, Si, Ga, and combinations thereof, the base substrate having volume resistivity >$10^{10}\Omega$-cm at 25° C.; depositing a film electrode onto the base substrate, the film electrode having a CTE ranging from 0.75 to 1.25 of the base substrate layer; overlaying the film electrode with a coating film layer having a CTE ranging from 0.75 to 1.25 of the film electrode.

13. The method of claim 12, wherein the deposition of the film electrode onto the base substrate is by at least one of screen-printing, spin coating, plasma spray, spray pyrolysis, reactive spray deposition, sol-gel, combustion torch, electric arc, ion implantation, sputtering deposition, laser ablation, evaporation, electroplating, and laser surface alloying.

14. The method of claim 13, wherein the deposition of the coating film layer onto the film electrode layer is by at least one of expanding thermal plasma, plasma enhanced chemical vapor deposition, metal organic chemical vapor deposition, metal organic vapor phase epitaxy, sputtering, ion plating, electron beam and plasma spray.

* * * * *